United States Patent [19]

Yasuoka et al.

[11] 4,084,311

[45] Apr. 18, 1978

[54] PROCESS FOR PREPARING COMPLEMENTARY MOS INTEGRATED CIRCUIT

[75] Inventors: Akihiko Yasuoka; Hiroshi Shibata, both of Itami, Japan

[73] Assignee: Mitsubishi Denki Kabushiki Kaisha, Tokyo, Japan

[21] Appl. No.: 732,859

[22] Filed: Oct. 15, 1976

[30] Foreign Application Priority Data

Oct. 17, 1975 Japan ................................. 50/124917

[51] Int. Cl.² ............................................. B01J 17/00
[52] U.S. Cl. ...................................... 29/571; 357/42
[58] Field of Search ........................ 29/571; 357/23, 42

[56] References Cited

U.S. PATENT DOCUMENTS

| 3,679,492 | 7/1972 | Fang et al. | 29/571 |
| 3,775,191 | 11/1973 | McQuhae | 357/42 X |

*Primary Examiner*—Gerald A. Dost
*Attorney, Agent, or Firm*—Oblon, Fisher, Spivak, McClelland & Maier

[57] ABSTRACT

A process for preparing a complementary MOS integrated circuit by forming a shallow first source-drain region near the gate; determining simultaneously the contact holes in the source-drain regions of both of the P-channel and N-channel transistors; forming a deep second source-drain region from the contact holes using thermal diffusion; and forming the electrodes at the contact holes.

6 Claims, 14 Drawing Figures

FIG. 7
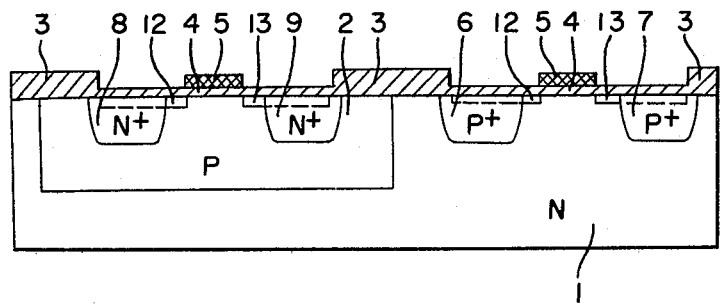
FIG. 8
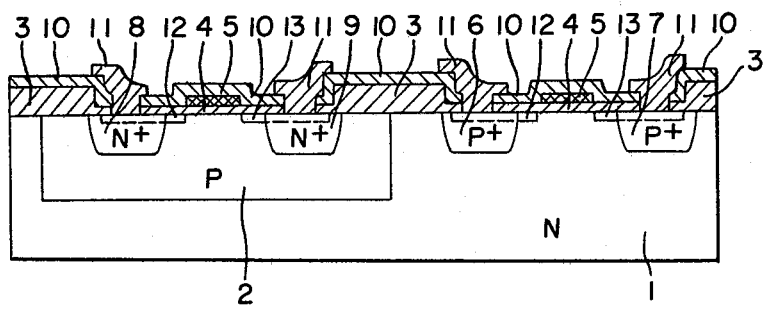
FIG. 9  INJECTION OF BORON IONS
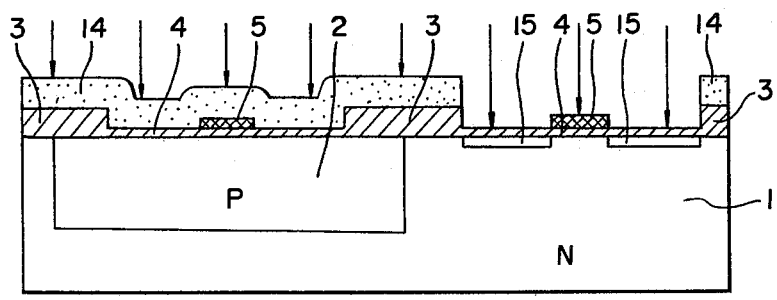

F I G. 10  INJECTION OF PHOSPHORUS OR ARSENIC IONS
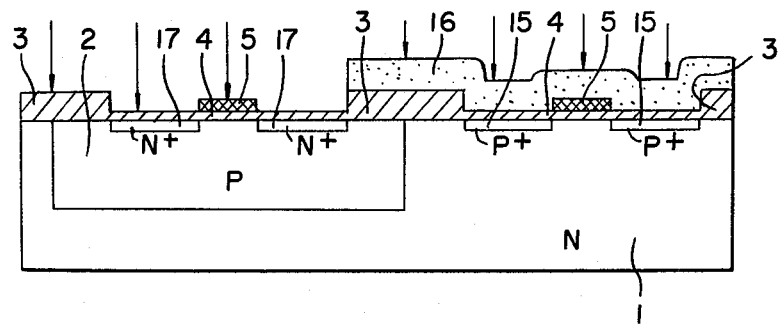
F I G. 11
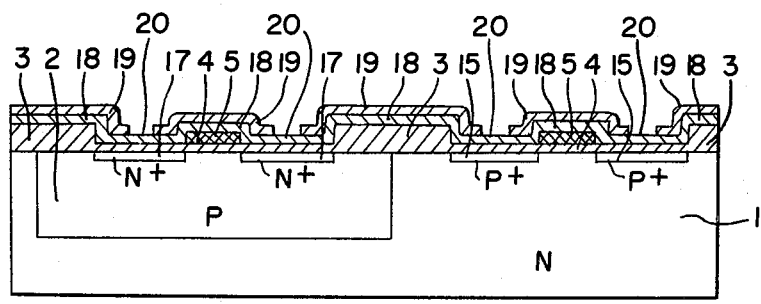
F I G. 12
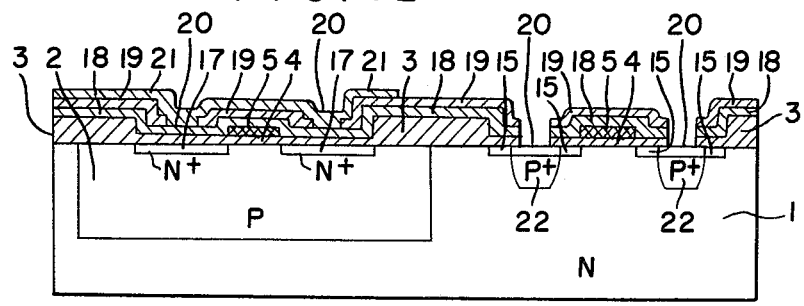

PROCESS FOR PREPARING COMPLEMENTARY MOS INTEGRATED CIRCUIT

BACKGROUND OF THE INVENTION

1. Field of the Invention

The present invention relates to a process for preparing a complementary MOS integrated circuit, more particularly, it relates to a short channel type complementary MOS integrated circuit which has a short channel length.

2. Description of Prior Art

Referring to FIGS. 1 and 2, the conventional process for preparing a silicon gate complementary MOS integrated circuit will be illustrated.

For example, a P-well (2) ($1 \times 10^{16}$ atoms/cm$^3$) is formed at a part of a N-type silicon substrate (1) having a concentration of an impurity of $4 \times 10^{14}$ atoms, by an ion injection method.

Then, a field oxide membrane 3 is formed on a region of a MOS transistor except the source-drain-gate of the MOS transistor. If necessary, a field dope is applied in this case. Then, a gate oxide membrane 4 having a thickness of about 1000 A 4 and a polycrystalline silicon having a thickness of about 4000 A 5 are respectively formed for a width of less than 5 microns. By the photo-engraving method, the predetermined parts such as a gate region are left. The structure in the stage is shown in FIG. 1.

An oxide membrane (not shown) is formed on the entire surface and then, the oxide membrane at the region for applying the P-channel source-drain diffusion, is removed by the photo-engraving method A P-type impurity such as boron is diffused into it by the conventional thermal diffusing method whereby the source 6 and the drain 7 (the concentration of the impurity at the surface of $10^{20}$ atoms/cm$^3$) of the P-channel MOS transistor are formed.

Then, the oxide membrane (not shown) is formed on the entire surface and then, the oxide membrane at the region for applying the N-channel source-drain diffusion is removed by the photo-engraving method. A N-type impurity such as arsenic and phosphorus, is diffused into it by the conventional thermal diffusing method whereby the source 8 and the drain 9 the concentration of the impurity at the surface of $10^{21}$ atoms/cm$^3$) of the N-channel MOS transistor are formed.

Then, the oxide membrane 10 is formed on the entire surface and a contact hole is formed for an aluminum wiring 11.

The structure in the stage is shown in FIG. 2. The diffusion depth at the source regions 6, 8 and the drain regions 7, 9 are about 1.5 microns. In the method, the source drain regions 6, 7 and 8, 9 are formed by diffusing the impurities with the mask of the gate polycrystalline silicon 5, whereby a self-matching gate structure is given.

For example, the structure of the N-channel MOS transistor near the gate polycrystalline silicon 5 is shown in FIG. 3. The source-drain regions 8, 9 are spread below the gate 5 for the diffusion depth to lateral direction. Accordingly, the effective channel length $L_{eff}$ is L-2Xj wherein L designates a width of the gate polycrystalline silicon 5 and Xj designates a diffusion depth. In order to obtain a high density structure of the complementary MOS integrated circuit, L should be minimized. However, when Xj is high, the control of $L_{eff}$ is difficult whereby the source-drain withstand voltage is decreased. On the contrary, when Xj is too low, the formation of the electrode in the source-drain region is difficult.

Accordingly, it has been difficult to decrease L to less than 5 microns in the structure of FIG. 3 as far as the conventional electrode forming method is employed.

In order to overcome the disadvantages, the other process having the steps of FIGS. 4 to 8 has been known.

In the process, in accordance with the former process having the step of FIG. 1, the P-well 2 and the field oxide membrane are formed as shown in FIG. 4.

Then, an oxide membrane (not shown) is formed on the entire surface and a hole is formed in the P-channel source-drain region, and the P-type impurity such as boron is diffused from it by the conventional thermal diffusion method whereby the source 6 and the drain 7 are formed.

Then, an oxide membrane (not shown) is formed on the entire surface and a hole is formed in the N channel source-drain region and the N-type impurity such as phosphorus is diffused into it by the conventional thermal diffusion whereby the source 8 and the drain 9 are formed. Then, the oxide membrane in the active region of the transistor is removed and a gate oxide membrane 4 is formed in the active region. The structure in the stage is shown in FIG. 5.

Then, a polycrystalline silicon membrane is formed, and the gate polycrystalline silicon 5 is left in the region between the source-drain as shown in FIG. 6 by the photo-engraving method. If necessary, the impurity is diffused into the polycrystalline silicon.

Then, the P-type impurity such as boron is injected in only the P-channel source-drain-gate region and the N-type impurity such as phosphorus is injected by the conventional ion injection in only the N-channel source-drain-gate region while masking the other part with the photoresist membrane.

The second source 12 and drain 13 are formed by the ion injection. The structure in the stage is shown in FIG. 7.

Then, the oxide membrane 10 is formed on the entire surface, and a contact hole is formed for the aluminum wiring 11. The structure in the stage is shown in FIG. 8.

The contact holes are formed at the first source-drain regions 6, 7 and 8, 9.

In accordance with the latter process, as shown in FIG. 8, the source-drain is not diffused below the gate polycrystalline silicon 5 as shown in FIG. 3 even though the diffusion depth of the first source-drains 6, 7 and 8, 9 are relatively deep. Moreover, it is unnecessary to form an electrode for the second source-drain 12, 13 whereby the depth of the second source-drain can be thin. Accordingly, the diffusion of the second source-drain 12, 13 below the gate polycrystalline silicon 5 can be effectively prevented and the width of the gate polycrystalline silicon L can be decreased.

However, in the latter process, the contact holes for the electrodes and the first source-drains 6, 7 and 8, 9 are separately formed. Accordingly, the steps are increased and an allowance for masking for the contact holes should be given in high level and the process has not been satisfactory for the preparation of the circuit having high density.

SUMMARY OF THE INVENTION

The present invention is to overcome the disadvantages and to prepare the complementary MOS integrated circuit by forming a shallow first source-drain region near the gate; determining simultaneously the contact holes in the source-drain regions of both of the P-channel and N-channel transistors; forming a deep second source-drain region from the contact holes by the thermal diffusion method and forming a shallow electrodes at the contact holes by the self-alignment method.

Accordingly, it is an object of the present invention to provide an improved process for preparing an improved complementary MOS integrated circuit. Another object of the invention is to provide a process for preparing a short channel type complementary MOS integrated circuit which has short width of a gate polycrystalline silicon.

Yet another object of the invention is to provide a process for preparing a complementary MOS integrated circuit having high density in which the allowance for masking for contact holes can be minimized.

BRIEF DESCRIPTION OF THE DRAWINGS

FIGS. 4 to 8 are sectional views for the description of the other conventional preparation of the short channel silicon gate MOS integrated circuit; and FIGS. 9 to 14 are sectional views for the description of the preparation of the complementary MOS integrated circuit according to the present invention.

DETAILED DESCRIPTION OF THE PREFERRED EMBODIMENTS

Referring to FIGS. 9 to 14, one embodiment of the invention will be illustrated. The steps of the preparation of the complementary MOS integrated circuit will be illustrated.

Figure 1:
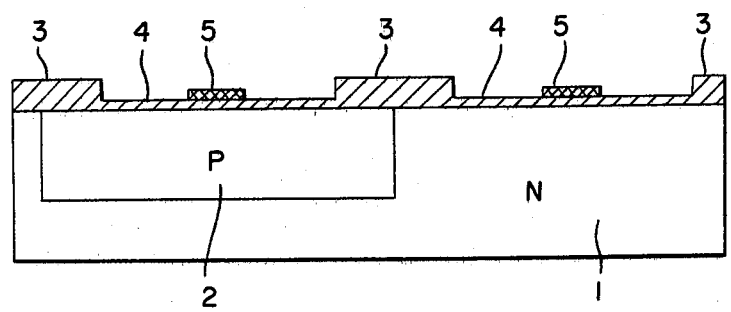
FIGS. 1 and 2 are sectional views for the description of the steps of the preparation of the conventional silicon gate complementary MOS integrated circuit.
Figure 2:
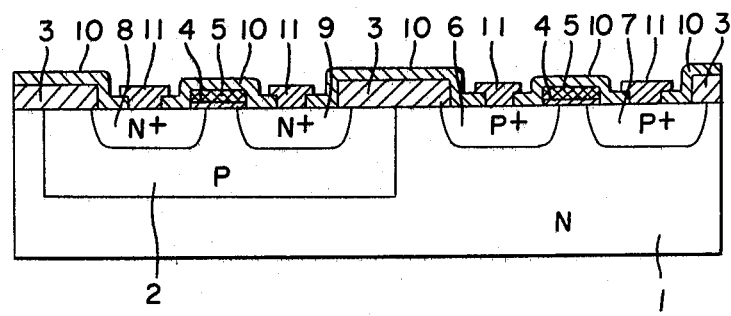
Figure 3:
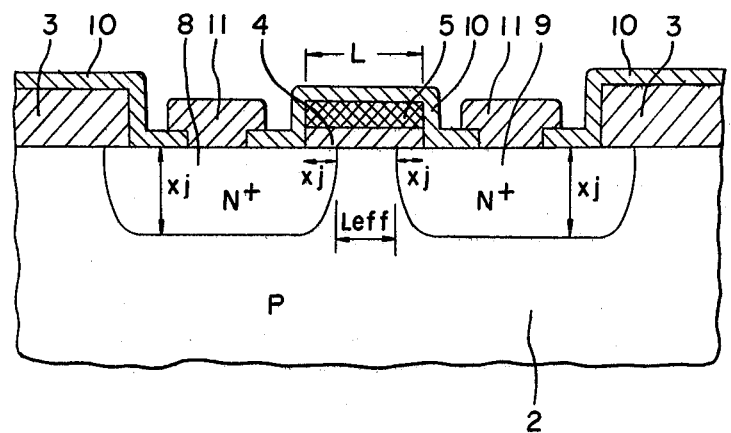
FIG. 3 is a sectional view for the detailed description of the structure of the complementary MOS integrated circuit near the gate.
Figure 4:
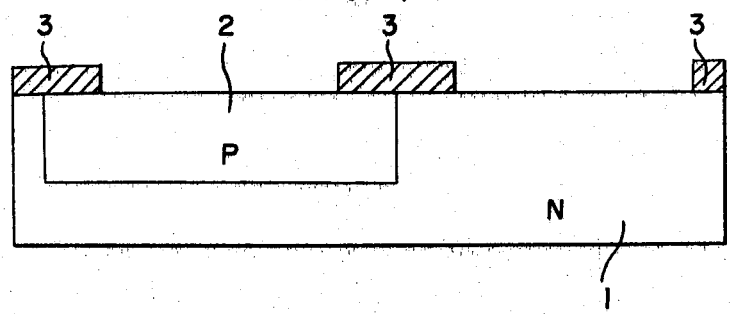
Figure 5:
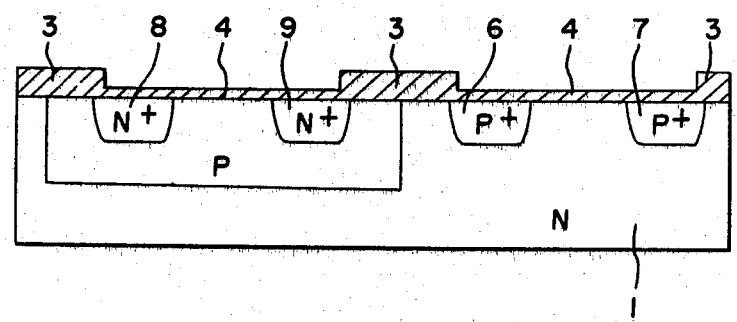
Figure 6:
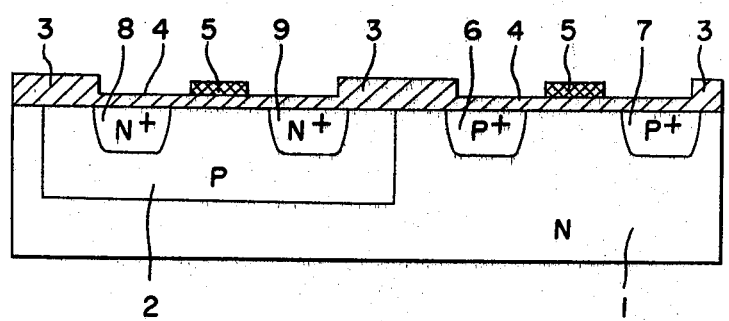

As stated on the structure of FIG. 1, the P-well 2, the field oxide membrane 3, the gate oxide membrane 4, and the gate polycrystalline silicon 5 are formed at parts of the N-type silicon substrate. (FIG. 1).

Then a photoresist membrane 14 having a thickness of 1 micron is coated on the entire surface and holes are formed in the source-drain-gate regions of the P-channel transistor by the photo-engraving method, and the P-type impurity such as boron is injected as ions into them at the energy of 60 KeV by the conventional ion injection. The resulting first source-drain 15 can be quite thin (such as the thickness of 0.2 micron and the surface concentration of $5 \times 10^{15}$ atoms/cm$^2$). The structure in the stage is shown in FIG. 9.

Then, the photoresist membrane 14 is removed and a photoresist membrane 16 having a thickness of 1 micron is newly coated on the entire surface and holes are formed in the source-drain-gate regions of the N-channel transistor and the N-type impurity such as phosphorus, arsenic is injected as ions into them at the energy of 180 KeV by the ion injection. The structure in the stage is shown in FIG. 10.

The depth of the resulting first source-drain 17 can be remarkably shallow (0.2 micron). Then, an oxide membrane 18 and a silicon nitride membrane 19 are respectively formed on the entire surface each in thickness of 1000 to 1500 A. The contact holes 20 are formed on the source, drain and gate by the photo-engraving method. (the gate is not shown). The structure in the stage is shown in FIG. 11.

After forming an oxide membrane 21 on the entire surface, the oxide membranes 4, 18, 21 for the contacts 20 in the P-channel transistor region are removed by the photo-engraving method whereby the surface of silicon and the surface of the polycrystalline silicon 5 are exposed. The oxide membranes 4, 18 are etched off by masking with a silicon nitride membrane 19, whereby the position and size of the exposed surface of the silicon are matched to those of the contact holes 20.

Then, the P-type impurity such as boron is diffused (the depth of 1.5 microns) by the conventional thermal diffusion to form the second source drain 22. The structure in the stage is shown in FIG. 12.

Then, an oxide membrane 23 is formed on the entire surface and the oxide membranes 21, 23 in the N-channel transistor region and the oxide membranes 4, 18 in the contact parts 20 are removed by the photo-engraving method whereby the parts of the source-drain 17 and the gate polycrystalline silicon 5 of the N-channel transistor are exposed.

Figure 13:
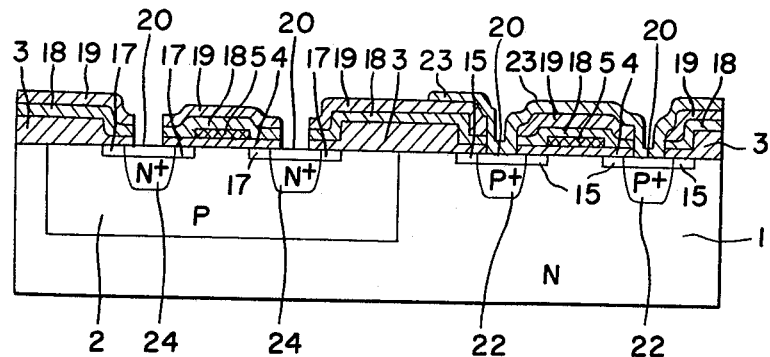

The N-type impurity such as phosphorus is diffused in a depth of 1.5 microns by the conventional thermal diffusion whereby the second source-drain 24 is formed. The second source-drain 24 is self-aligned to the contact holes 20 as the case of the P-channel transistor. The structure in the stage is shown in FIG. 13.

Figure 14:
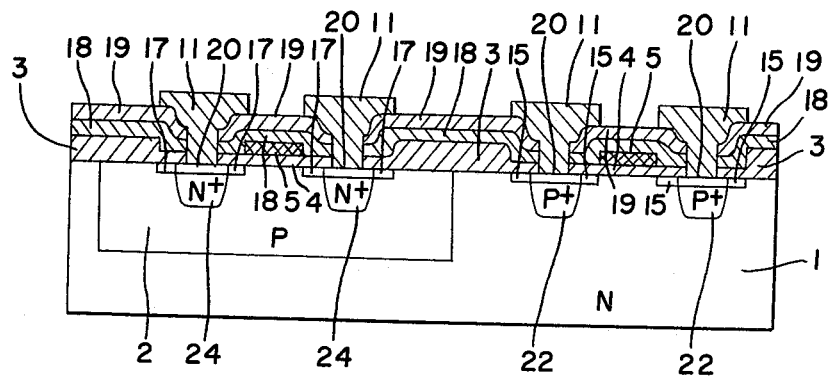

Then, the oxide membrane 23 covering the entire region of the P-channel transistor is removed whereby the surface of the silicon and the surface of the polycrystalline silicon at the contact holes 20 are exposed. The aluminum wiring 11 is made on it. The structure in the stage is shown in FIG. 14.

As stated above, in accordance with the invention, the source-drain 22, 24 below the contact holes 20 are departed from the gate polycrystalline silicon 5 whereby the depth of the diffusion can be relatively deeper and the electrodes can be formed by the conventional method. The source-drains 15, 17 adjacent to the gate polycrystalline silicon 5 are formed by the ion injection whereby the depth of the diffusion can be sufficiently shallow, and the diffusion below the gate polycrystalline silicon (the diffusion in lateral direction) can be minimized and the width L of the gate polycrystalline silicon can be shortened. Moreover, it is unnecessary to give the allowance for masking on the pattern because the contact holes 20 are self-aligned to the source-drains 22, 24 and the integrated circuit density can be improved corresponding to the decrease of the allowance. These advantages are attained.

In accordance with the invention, it is possible to obtain a short channel complementary MOS integrated circuit having a gate length of less than 5 microns. Obviously, numerous additional modifications and variations of the present invention are possible in light of the above teachings. It is therefore to be understood that within the scope of the appended claims, the invention may be pacticed otherwise than as specifically described herein.

What is claimed as new and desired to be secured by Letters Patent of the United States is:

1. A process for preparing complementary MOS integrated circuit which comprises the steps of:

forming a second semiconductor layer having the second conductive type in a region of a first semiconductor layer having the first conductive type;

forming a oxide membrane on a first predetermined surface zone of said first semiconductor layer and said second semiconductor layer;

forming a gate electrode on a second predetermined surface zone on said oxide membrane;

forming a first masking layer at the surface of said first semiconductor layer except said first predetermined surface zone;

forming a first source and drain regions of a P channel transistor by injecting ions of an impurity having the scond conductive type from the surface of the body of said semiconductor;

forming a second masking layer at the part of said second semiconductor layer except said first predetermined surface zone;

forming the first source and drain regions of a N channel transistor by injecting ions of an impurity having the first conductive type from the surface of the body of said semiconductor;

forming a silicon nitride membrane on said oxide membrane and said gate electrode;

forming contact holes in said silicon nitride layer on a third predetermined surface zone on said first source and drain regions which is narrower than the silicon nitride layer;

removing said oxide membrane from beneath the contact holes;

forming the second source and drain regions of said P-channel transistor by diffusing an impurity having the second conductive type from said contact holes on said P-channel transistor region;

forming the second source and drain regions of said N channel transistor by diffusing an impurity having the first conductive type from said contact holes of said N channel transistor region; and forming contacts at said source and drain regions.

2. A process according to claim 1 wherein said gate electrode is a polycrystalline silicon.

3. A process according to claim 1 wherein said first and second masking layers are made of a photoresiste membrane.

4. A process according to claim 1 wherein said first source and drain region respectively have a depth of about 0.2 micron.

5. A process according to claim 4 wherein said second source and drain region respectively have a depth of 1.5 microns.

6. A complementary MOS integrated circuit prepared by the steps of claim 1.

* * * * *